(12) United States Patent
Bazinet

(10) Patent No.: US 8,237,438 B2
(45) Date of Patent: Aug. 7, 2012

(54) VERY LOW NOISE MAGNETOMETER

(75) Inventor: Robert Bazinet, Thornhill (CA)

(73) Assignee: Quantec Geoscience (CA)

( * ) Notice: Subject to any disclaimer, the term of this patent is extended or adjusted under 35 U.S.C. 154(b) by 507 days.

(21) Appl. No.: 12/403,564

(22) Filed: Mar. 13, 2009

(65) Prior Publication Data

US 2010/0231222 A1   Sep. 16, 2010

(51) Int. Cl.
*G01R 33/04* (2006.01)

(52) U.S. Cl. ....................................................... 324/253

(58) Field of Classification Search .................. 324/253
See application file for complete search history.

(56) References Cited

U.S. PATENT DOCUMENTS

| | | | | |
|---|---|---|---|---|
| 2,585,956 A * | 2/1952 | McCarthy | | 33/356 |
| 3,564,401 A * | 2/1971 | Coon | | 324/260 |
| 3,943,436 A * | 3/1976 | Pirson et al. | | 324/345 |
| 4,216,394 A * | 8/1980 | Leidich | | 327/540 |
| 4,475,078 A * | 10/1984 | Itani | | 324/529 |
| 4,977,374 A * | 12/1990 | Kleiner | | 324/254 |
| 5,327,089 A * | 7/1994 | Ouellette | | 324/345 |
| 5,629,626 A * | 5/1997 | Russell et al. | | 324/345 |
| 6,282,803 B1 * | 9/2001 | Dunne | | 33/361 |
| 6,466,012 B1 * | 10/2002 | Mouri et al. | | 324/249 |
| 2001/0026222 A1 * | 10/2001 | Canady et al. | | 340/573.1 |
| 2002/0121872 A1 * | 9/2002 | Boisvert et al. | | 318/469 |
| 2004/0080316 A1 * | 4/2004 | Friend et al. | | 324/244 |
| 2004/0119470 A1 * | 6/2004 | Yajima et al. | | 324/253 |
| 2007/0103152 A1 * | 5/2007 | Cripe | | 324/253 |
| 2008/0246485 A1 * | 10/2008 | Hibbs et al. | | 324/332 |
| 2009/0243609 A1 * | 10/2009 | Hasunuma | | 324/253 |

* cited by examiner

*Primary Examiner* — Bot Ledynh

(74) *Attorney, Agent, or Firm* — Wilmer Cutler Pickering Hale & Dorr LLP.

(57) ABSTRACT

Disclosed herein is a very low noise fundamental mode orthogonal fluxgate magnetometer. Also disclosed is a method of measuring a magnetic field, and an integrated magnetotelluric station that can measure X, Y, and Z components of a magnetic field.

37 Claims, 15 Drawing Sheets

VERY LOW NOISE MAGNETOMETER

FIELD OF INVENTION

The present invention relates generally to methods and apparatus for very low noise magnetometers.

DESCRIPTION OF RELATED ART

A basic "fundamental mode" orthogonal fluxgate magnetometer is made from a piece of magnetic metallic alloy over which a sensing coil is wound. An excitation current flows through the magnetic element. In some aspects, this element is a wire, a ribbon, or other shaped amorphous magnetic material. In other aspects, the magnetic element is a wire, ribbon, or other shaped magnetic alloy. The excitation current has a DC component on which is superimposed a smaller high frequency sinusoidal AC excitation current. The sum of the two is such that the current does not change polarity. Paperno, *Suppression of Magnetic Noise in the Fundamental-Mode Orthogonal Fluxgate*, Ben-Gurion University of the Negev (2004) has shown that the "fundamental mode", i.e. DC-biased, orthogonal fluxgate originally proposed by Sasada, *Orthogonal Fluxgate Mechanism Operated with DC Biased Excitation*, Journal of Applied Physics 91, 10 (2002) has very good noise performance.

The signal picked, or picked up, from, i.e. by, the sensing coil, at the same frequency as the AC excitation current, is made of two components, the amplitude of one of which is proportional to the applied external magnetic field. However, there is also a strong "offset" component, which is not related to the applied field, but rather to the magnetic and mechanical properties of the sensor elements.

Of course, one can apply flux feedback to these magnetometers. The magnetometer sensor operates near zero field by applying to the sensor a magnetic field equal and opposite to the ambient field to be measured. An electronic circuit detects any change in the sensor output and corrects the compensation field in a way to bring back the output of the sensor to zero. The value of the compensation field is output as the measured field. In the presence of an offset, this system will try to null the sensor output. The magnetic field at the physical sensor will be not be exactly zero, but equal to the offset. The offset will be part of the output, which will show the sum of the offset plus the ambient field.

The output signal amplitude is also proportional to the excitation current. The magnetic wire resistance is relatively high and variable. Voltage driving the magnetic wire is a major cause of drift.

FIG. 1 illustrates a basic fundamental mode orthogonal fluxgate magnetometer of the prior art. A basic fundamental mode orthogonal fluxgate is made from a piece of amorphous magnetic alloy 106 over which sensing coil 108 is wound. Excitation current 116 flows through amorphous magnetic alloy 106. Excitation current 116 has a DC component on which is superimposed a smaller high frequency sinusoidal AC excitation current. The sum of the DC component and the smaller high frequency sinusoidal AC excitation current is such that excitation current 116 does not change polarity.

The signal picked up by the sensing coil, at the same frequency as the AC excitation current, is made of two components, the amplitude of one of which is proportional to the applied external magnetic field. However, there is also a strong "offset" component, which is not related to the applied field but rather to the magnetic and mechanical properties of the sensor elements.

The amplitude of the signal picked up from the sensing coil can be expressed as:

$$S = (k*H + O)*I_{drv} \text{ where}$$

S is the output amplitude
k is the sensor sensitivity
H is the external magnetic field
O is the offset
Idrv is the AC excitation current The magnetometer is completed by a device, following the sensing coil, to measure the amplitude, S, of the signal. As illustrated in FIG. 1, this is typically made from amplifier 110, bandpass filter 112 at the excitation frequency, and phase sensitive detector 114.

The offset is quite large and presents problems when the fields to be measured are small. The high offset value prevents one from increasing the electronics gain to see very small magnetic fields. The offset needs to be cancelled to be able to detect very low value magnetic fields.

Sasada and Kashima, *A Simple Design of an Orthogonal Fluxgate Magnetometer of Fundamental Mode*, Kyushu University (2008) as well as Goleman and Sasada, *A Triaxial Orthogonal Fluxgate Magnetometer Made of a Single Magnetic Wire With Three U-Shaped Branches*, IEEE Transactions on Magnetics 43, 6 (2007) offered a partial solution: referring to FIG. 2, folding the magnetic element unto itself, in U shape 226, and inserting U shaped wire 226 into sensing coil 108, they were able to cancel a large proportion of the offset. As the offset polarity is proportional to the direction of the current in the wire and each branch of the loop has the same current going in an opposite direction, the offset should, in theory, cancel. The polarity of the signal from the applied field, in contrast, is proportional to the product of the direction of the excitation current with the direction of the applied field. The signal from both branches of the loop will add. In practice, imperfections in the physical implementation prevent a full cancellation of the offset. Furthermore, some leakage due to the capacitance and mutual inductance between excitation element 226 and sensing coil 108 add to the residual offset. The folded wire approach does help somewhat to reduce the offset but is not sufficient for all desired levels of performance.

Noise

Magnetotelluric and similar geophysical surveys often need very sensitive low noise magnetometers operating in the range of approximately 0.001 Hz to at least several hundred Hertz. Large induction coils have traditionally been the sensor of choice for such applications. Large induction coils do provide the noise level required. For example, a Phoenix MTC-50 induction coil is specified at 0.3 pT/rthz (pico Tesla/square root (Hz)) at 1 Hz. On the other hand, such coils are large and heavy. The same MTC-50 coil weighs over 10 kg, and is nearly 1.5 m long. As three of them would be necessary at a single station to measure the 3 axes of the magnetic field, using them, which generally involves carrying them in the field and burying them, is a major logistic problem.

One potential alternative is to use superconductive "squid" magnetometers. Squid magnetometers do provide the required noise performance, but are generally very expensive and have logistic problems of their own. One such logistic problem with squid magnetometers is carrying liquid helium in the field. Furthermore, such magnetometers tend to be lightweight, but also very sensitive to wind induced vibrations. They generally need to be bolted to a massive base to prevent that problem, and such bolting cancels any weight advantage over induction coils.

Conventional flux gate magnetometers are much smaller, on the order of centimeters, but, unfortunately too noisy for the job. Some of the best of the "low noise" commercial fluxgates provide 10 to 20 pT/rtHz at 1 Hz. Very expensive selected units do somewhat better. A Bartington Mag-03 selected for low noise is specified at 6 pT/rtHz. Even achieving this order of performance is difficult with fluxgates and can not generally be done reliably. The very best ones are individually selected and sold as low noise units.

Difference Between Conventional Orthogonal Fluxgates and Fundamental Mode Orthogonal Fluxgates The physical sensor head of a fundamental mode orthogonal fluxgate can be identical to one used in a conventional orthogonal fluxgate. Both are made of a magnetic core, usually a wire, inside a sensing coil. The difference is in the physical principles involved and in the excitation waveforms.

In a conventional orthogonal fluxgate, the sensor is driven by a strong AC waveform which saturates the core. The applied field to be measured shifts the saturation point in different directions on each polarity of the drive waveform. The output signal is some derivative of the difference in saturation time on both alternances of the drive waveform. A more detailed explanation of the mechanism can be found in Ripka, *Magnetic Sensors and Magnetometers*, Artech House, 2001.

Sasada (2002) explains the operation of the "Fundamental mode" orthogonal fluxgate. Essentially, the drive waveform is replaced by a DC current on which is superposed a small AC sine wave, the magnitude of which is smaller than the DC bias. The applied field on the core never reverses and the core does not saturate. An applied field essentially rotates the magnetization vector from a totally radial direction towards an axial direction that can be picked up by the sensing coil. The amplitude of this rotation, and by consequence, the sensor output, is proportional to the applied field. Refer to Sasada (2002) for a more detailed explanation.

Conventional fluxgates work with any kind of magnetic core, crystalline or amorphous. "Fundamental mode" fluxgates typically use amorphous cores.

BRIEF SUMMARY OF EMBODIMENTS OF THE INVENTION

In accordance with one or more aspects of the invention a fundamental mode orthogonal fluxgate magnetometer is disclosed with a magnetic alloy sensing element, an optional current source to supply an excitation current to the sensing element, a sensing coil wound over the sensing element, an amplifier, and a signal detector, where the excitation current includes a DC component on which is superimposed a smaller, high frequency, AC excitation current, where the sensing coil picks up a signal proportional to an applied magnetic field, where the amplifier amplifies the signal picked up by the sensing coil, and where the detector detects the amplified signal and produces an output voltage proportional to the applied magnetic field. Also disclosed is an electronic circuit to null the magnetometer offset and an electronic circuit to null residual AC leakage. The detector can output a digital number proportional to the magnetic field. Some magnetometers further include a second sensing coil and a second amplifier to amplify the signals picked up from the second sensing coil, where the wire comprises a plurality of branches, where each branch of the wire goes through an individual sensing coil, where each individual sensing coil is amplified individually by an amplifier, where at least one of the amplifiers has an adjustable gain, where the outputs of the plurality of amplifiers are summed to provide a final output, and where the offset of the final output is nulled by adjusting the gain of the at least one adjustable gain amplifiers.

The magnetometer sensing element can be a wire, including an amorphous magnetic alloy wire, and the wire is sometimes split in two parallel branches, each of which can be driven by a different current. The magnetometer offset of the final output can be nulled by the difference in current. Some of the two branch magnetometers use a compensation current, from a compensation current source at a midpoint of the wire, to provide a different drive current in each branch. Also disclosed is a second coil wound over the sensing coil, a compensating circuit including a coupling capacitor, an adjustable attenuator, and a switchable polarity reverser, where the compensating circuit takes a sample of the high frequency AC part of the excitation current and applies it to the second coil to create a field substantially equal and opposite to the magnetometer offset. The magnetometer can include a 90 degrees phase shifter, a second attenuator, and a summer, where the phase shifter provides a 90 degrees shifted sample of the high frequency AC part of the excitation current and where the phase shifted sample is attenuated by the second attenuator and applied to the nulling coil. Some of these magnetometers further include an adjustable capacitor and a second summer, where residual AC leakage is nulled by the adjustable capacitor. The magnetometer can output a digital number proportional to the magnetic field, or one or more components thereof. Electronic circuits can be used to null both the magnetometer offset and residual AC leakage, sometimes including an adjustable capacitor located between the current source and the signal path of the amplifier. Some magnetometers also include processing software for calculating the magnetic field. Some magnetometers are contained in a single package. Magnetometers can also include integrated timing devices, GPS receivers by way of nonlimiting example, for synchronizing the magnetometer to other magnetometer units. They can also include integrated inclination sensors for correcting leveling errors and integrated data recorders for storing an output digital number. Some magnetometers include circuits for measuring the electrical fields from external electrodes and for recording or transmitting the measure of the electrical fields with the output digital number.

Also disclosed are methods of measuring magnetic fields. One method comprises driving a magnetic alloy sensing element from a current source, producing an excitation current to flow through the sensing element, where the excitation current has a DC component on which is superimposed a smaller, high frequency AC excitation current, picking up a signal proportional to the applied magnetic field from a sensing coil wound over the sensing element, amplifying the signal picked up from the sensing coil, and detecting the amplified signal to produce an output voltage proportional to the applied magnetic field. Other methods do not require a current source. Some methods also include nulling the magnetometer offset with an electronic circuit and/or nulling residual AC leakage with an electronic circuit.

Also disclosed is an integrated magnetotelluric station comprising three fundamental mode orthogonal fluxgate magnetometers, one magnetometer to measure each of the X, Y, and Z magnetic components, two electric inputs, one each for the X and Y electric fields, a timing device, a data recording device, and an interface to an operator console for setting up parameters of the magnetometer, where each fundamental mode orthogonal fluxgate includes a magnetic alloy sensing element, a current source to supply current to the sensing element, a sensing coil wound over the sensing element, an amplifier, and a signal detector, wherein each sensing coil of each fundamental mode orthogonal fluxgate picks up a signal proportional to a respective component applied magnetic field, where each current source for each fundamental mode orthogonal fluxgate generates an excitation current to flow through the respective sensing element, where each excitation current has a DC component on which is superimposed a smaller, high frequency AC excitation current, where each amplifier amplifies the signal picked up from the respective sensing coil, and where each detector detects the amplified signal of the respective amplifier and produces an output voltage proportional to the respective component of the applied magnetic field. The timing device can be a GPS receiver. Some stations further include a high speed data link to transmit data to a central processing station. Some include an integrated inclination sensor for correcting leveling errors. Some stations further include electronic circuits to null residual leakage, some of these circuits including an adjustable capacitor.

BRIEF DESCRIPTION OF THE DRAWINGS

For a more complete understanding of various embodiments of the present invention, reference is now made to the following descriptions taken in connection with the accompanying drawings in which.

DETAILED DESCRIPTION OF THE PREFERRED EMBODIMENTS

Figure 1:
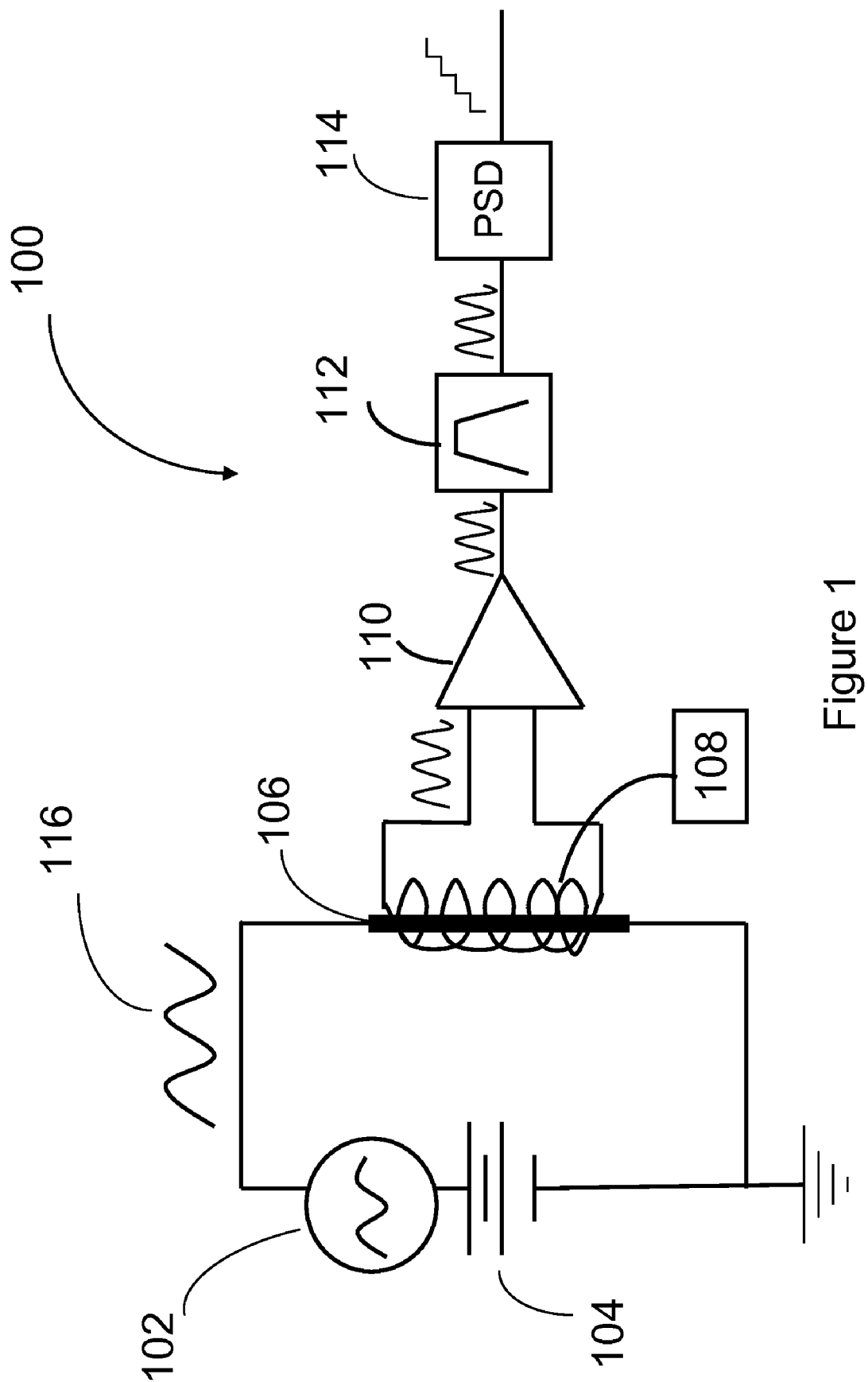
FIG. 1 illustrates a basic fundamental mode orthogonal fluxgate magnetometer of the prior art.
Figure 2:
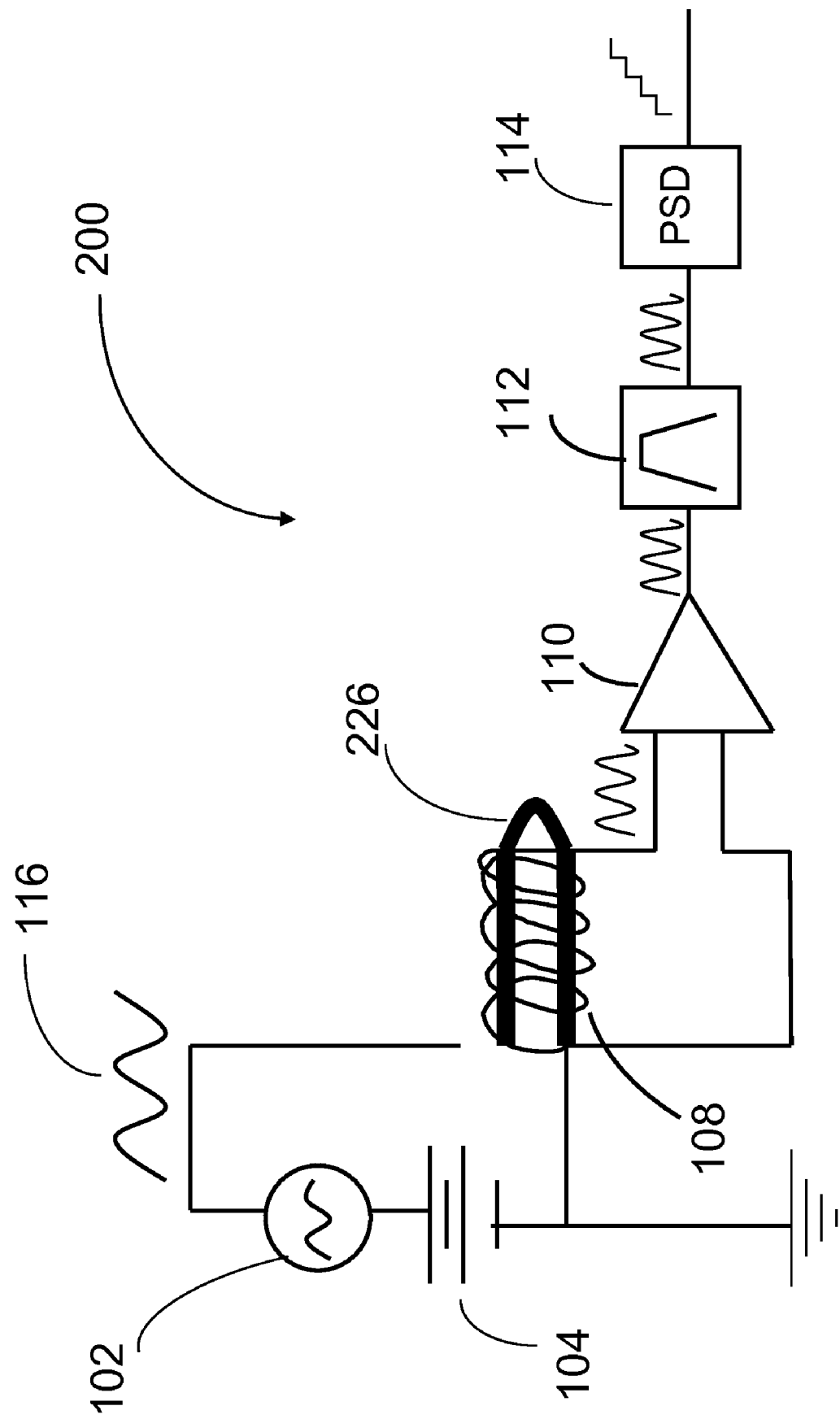
FIG. 2 illustrates an improved fundamental mode orthogonal fluxgate of the prior art.
Figure 3:
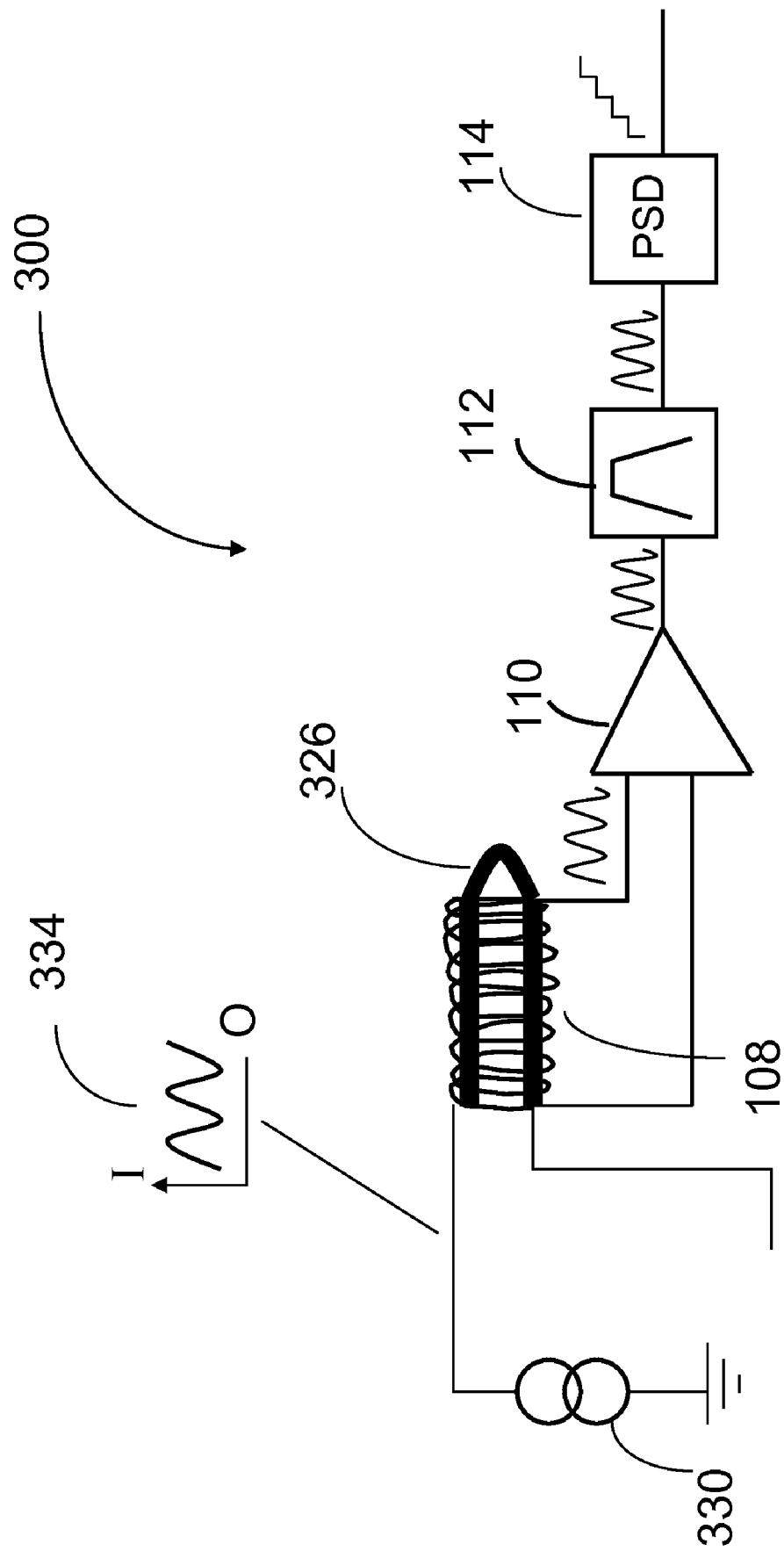
FIG. 3 illustrates a current source according to an aspect of the invention.

According to one aspect of the present invention, shown in FIG. 3, excitation element, i.e. sensing element, 326 is driven from a regulated current source, supplying current 334 which is made of a sum of the DC bias and the sinusoidal excitation waveform instead of the voltage sources that were used in the prior art. The resistance of the magnetic wires used as the sensing element has a strong temperature coefficient. With a voltage source, the drive current will vary according to this resistance and to temperature changes due to both ambient temperature and self heating of the sensor wire. This will ultimately mean drift in the sensitivity and offset of the sensor. Furthermore, a small misalignment of the sensor wire would mean that some of the magnetic field produced by the DC current in the drive wire will affect the measured field. There will also be some drift in the absolute value of the measured field. Using a current source makes the drive current independent of the variations in the resistance of the sensor wire, thus eliminating these drift sources. Of course, while FIG. 3 illustrates current source 330 applied to folded sensor wire 326, it is also applicable to a straight sensor of the prior art, as illustrated in FIG. 1.

Figure 4:
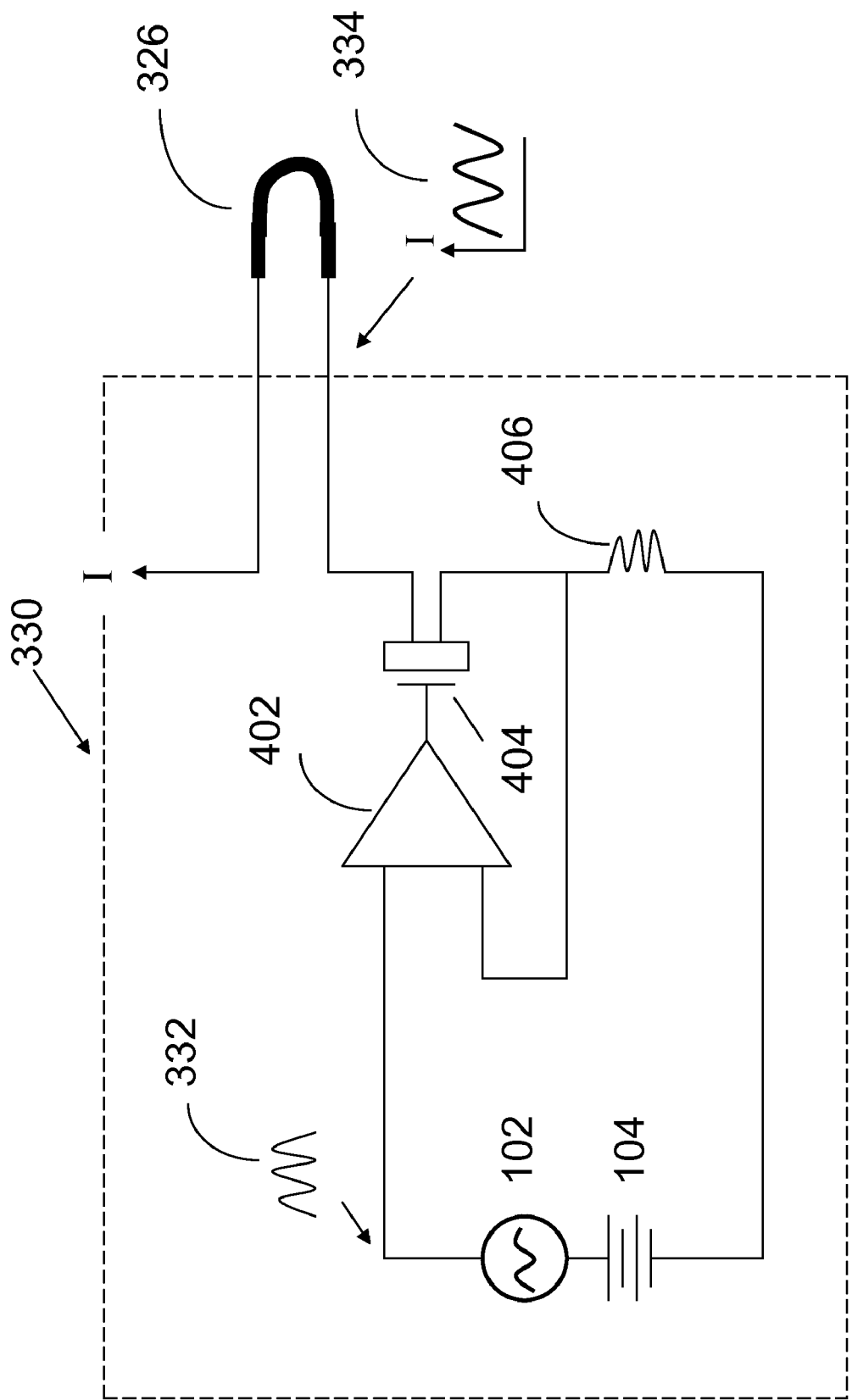
FIG. 4 also illustrates a current source according to an aspect of the invention.

There are a multitude of ways to implement current sources. The electronic literature gives numerous examples. Some of them can be found in Giacoletto, *Electronics Designer's Handbook* (1977), as well as in Texas Instruments application bulletins SBOA046 (1990) and SBEA001 (2001). FIG. 4 illustrates an implementation of current source 330 according to one aspect of the invention. Operational amplifier 402, driving the transistor 404, forces the voltage across resistor 406 to be equal to the applied voltage at point 332. By Ohm's law, the current through resistor 406 is proportional to the voltage across the terminals and is thus proportional to the voltage applied at point 332. The current flowing through resistor 406 also flows through transistor 404 and the excitation element 326 connected to point 334. The voltage applied to point 332 is the same sum of DC bias 104 and sinusoidal excitation voltage 102, with the difference that the current at point 334 is now independent of the resistance of sensing element 326.

Noise

Fundamental mode orthogonal fluxgate magnetometers can achieve noise similar to the best conventional flux gates with a lot less effort. Current literature, for example Paperno (2004), show a noise figure of 6 to 10 pT/rthz, still not good enough to compare with induction coils.

Magnetometers according to some aspects of the current invention achieve a noise figure better than 1 pT/rthz and have comparable noise performance to induction coils while using sensor heads that are only 1 mm in diameter and 30 mm long. A complete triaxial magnetometer using technology according to some aspects of the invention can, without any significant effort, be packed in a case the size of a standard coffee can.

Frequency Range

The fundamental mode orthogonal fluxgate according to some aspects of the current invention are designed for DC to 400 Hz. However, the frequency response has little to do with the sensor itself. Any limitation in frequency response will be a consequence of the measurement electronics or the speed of the processing software. Increasing the top frequency two orders of magnitude to approximately 40 khz will not cause any technical problem. On the other hand, wider bandwidth means a reduced dynamic range and more external noise pickup. The appropriate bandwidth for a given application is a compromise optimized for that job.

Offset Nulling

As discussed above, the folded wire approach to offset nulling is insufficient for an extremely sensitive magnetometer. Whichever nulling approach is used, however, the offset nulling is preferably trimmed with the sensor in a shielded enclosure, which significantly reduces, and preferably eliminates, any outside magnetic field.

Dual Amplifier Nulling

Figure 5:
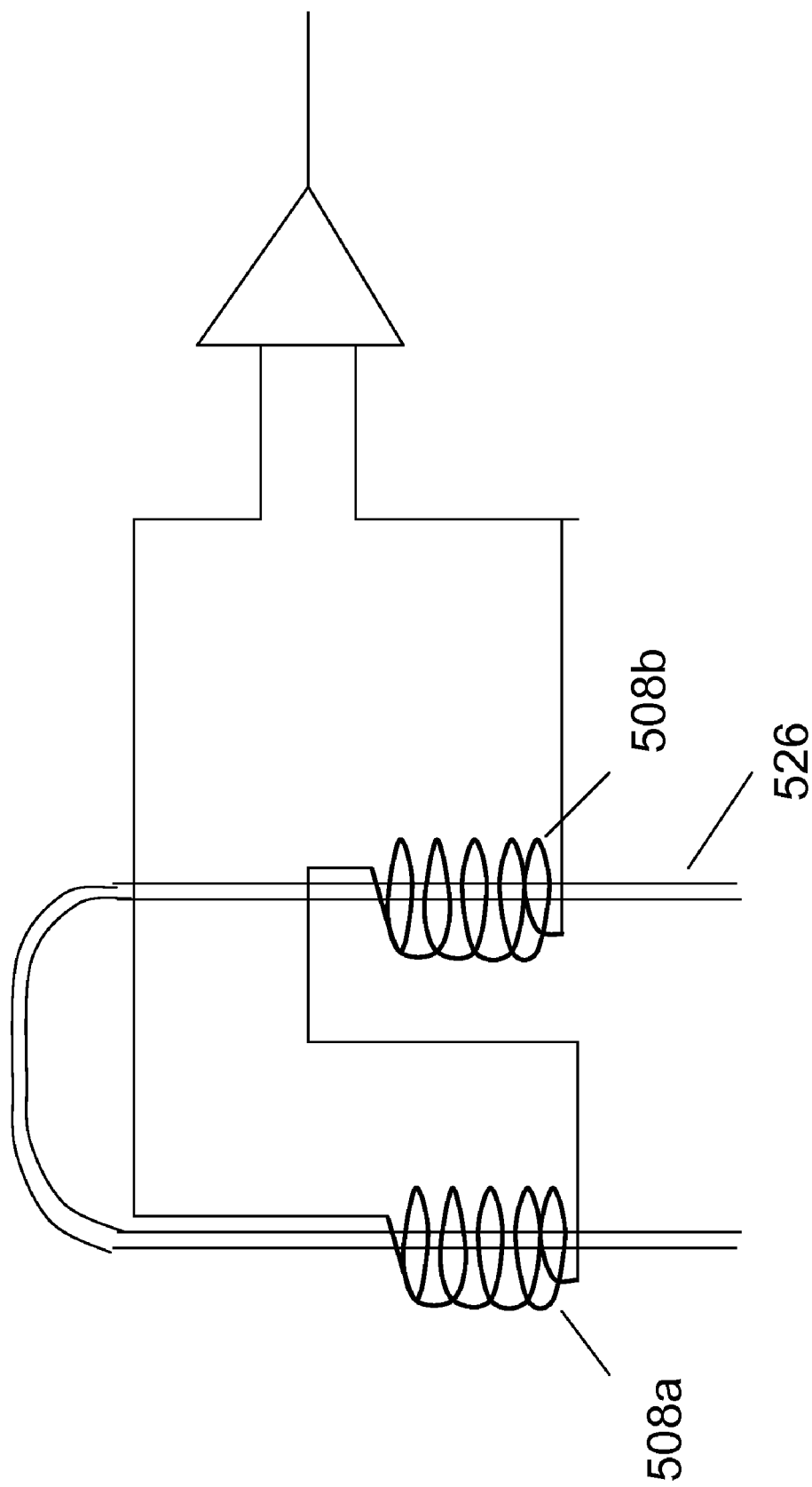
FIG. 5 illustrates an offset nulling scheme of the prior art.

Referring to FIG. 5, one of the offset nulling schemes proposed by Sasada & Kashima (2008) include two series connected identical sensing coils 508a and 508b, one on each branch of sensing element 526. This partially cancels the offset but does not address the imperfections in construction which results in differences between the two branches.

Figure 6:
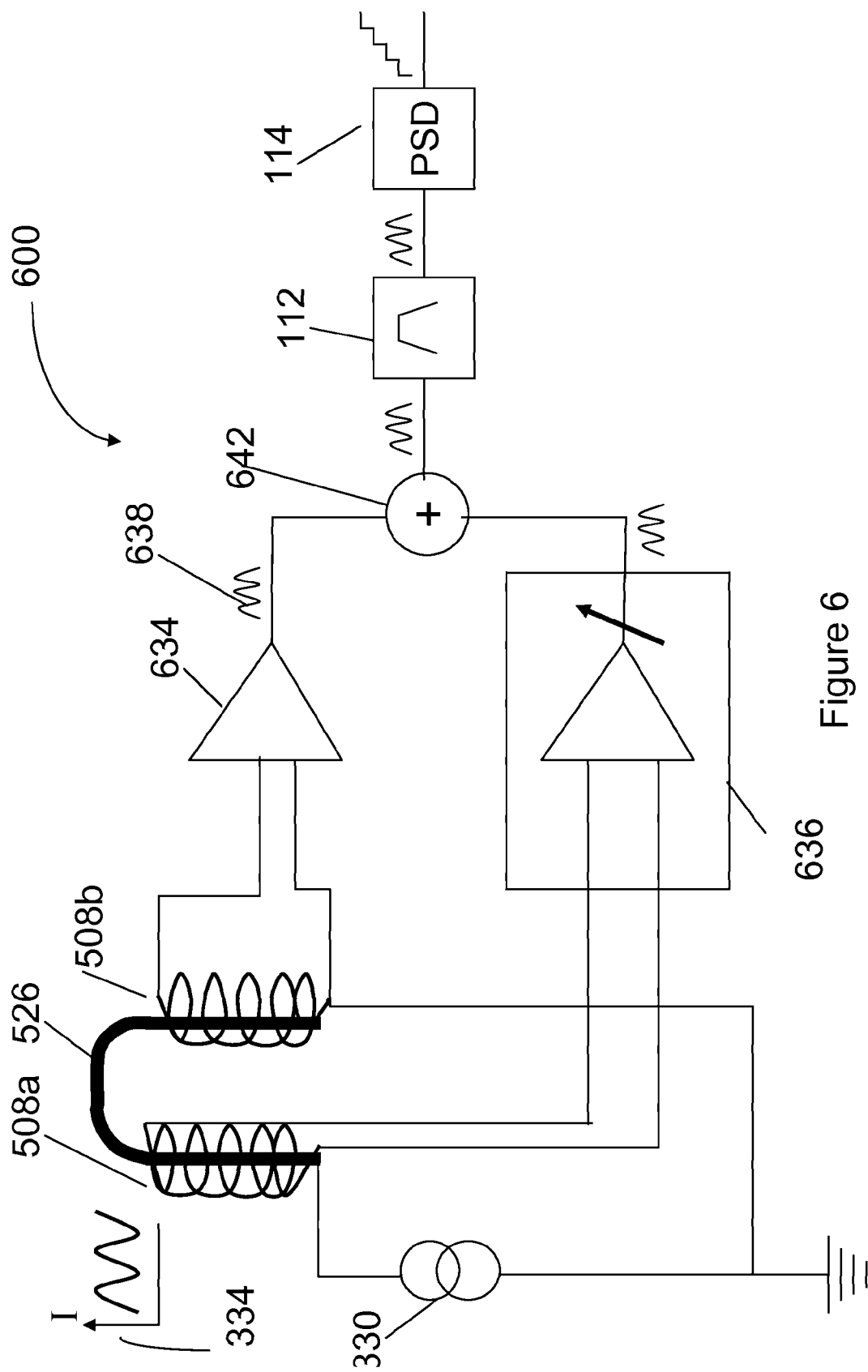
FIG. 6 illustrates separate amplifiers for each sensing coil according to an aspect of the invention.

According to one aspect of the invention, the offset cancellation is substantially improved by active or electronic implementations. Various implementations can achieve offset cancellation. In one of which, illustrated in FIG. 6, separate amplifiers 634 and 636 are used for each sensing coil 608a and 608b. At least one of the amplifiers, 636 in FIG. 6, has a variable gain. The outputs of the two amplifiers are then summed in 642 before being applied to the filter and detector as in the usual implementation. The different gains in each branch compensate for the different offsets of each side. The adjustable amplifier 636 is set, in the absence of any outside applied field, for the amplitude of the signal at its output 640 to be equal and opposite to the signal from the fixed amplifier, 638. The output of the summer in this case is zero, having effectively cancelled the offset.

Figure 7:
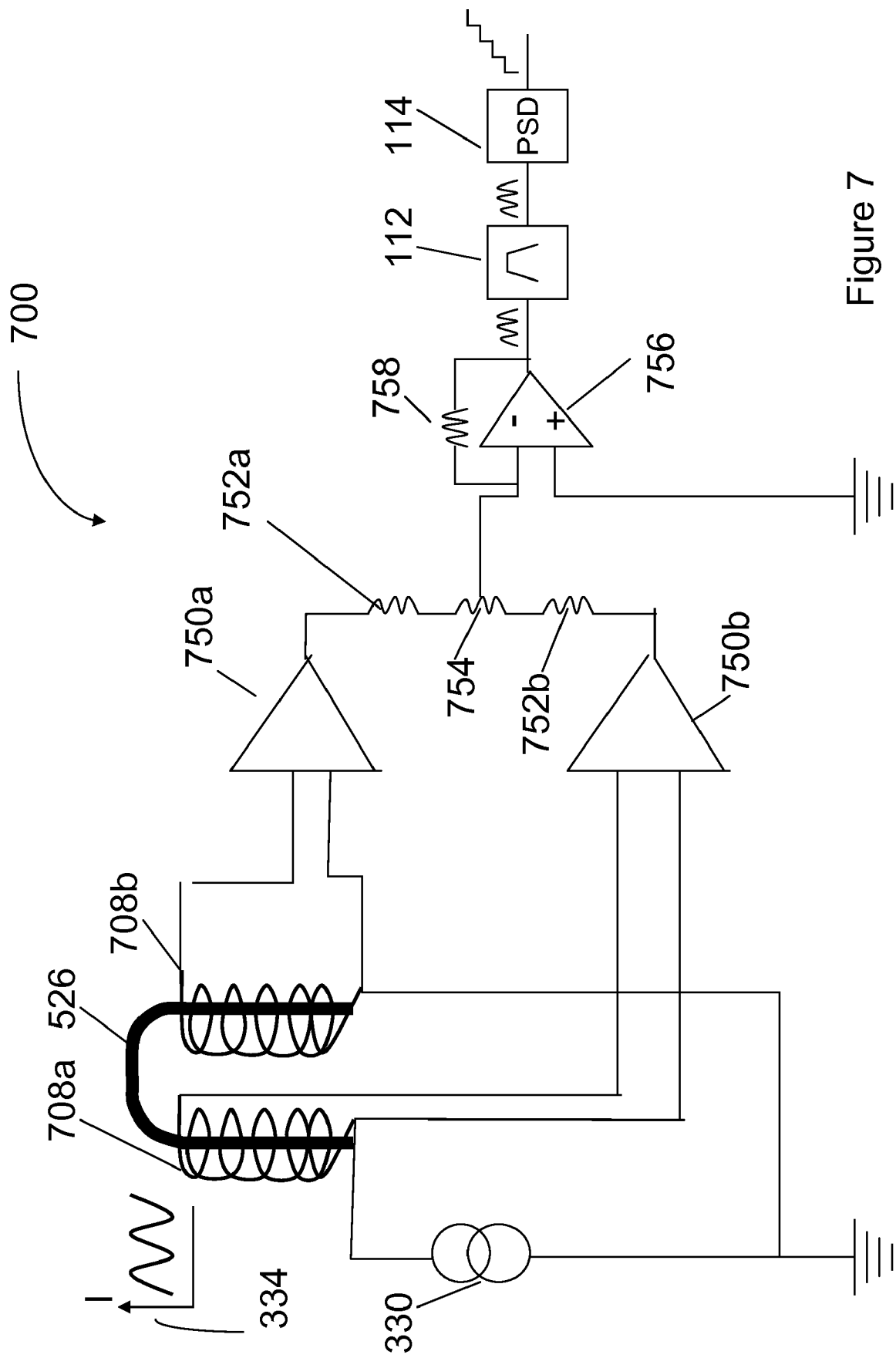
FIG. 7 illustrates a practical implementation of another aspect of the invention.

FIG. 7 illustrates a practical implementation of this aspect of the invention.

Each sensing coil 708 drives a fixed gain preamplifier 750, the output of which are applied to an adjustable summing amplifier made of operational amplifier 756 and resistors 752a, 752b, 754, and 758. Trimmer potentiometer 754 nulls the offset. Assuming that trimmer 754 has no resistance, the gain of the summing amplifier, from each preamplifier 750 to the output, is the ratio of resistor 758 divided by resistor 752. Adding some resistance on one side, using trimmer 754 and simultaneously removing some from the other side increases the gain from one sensing coil while reducing it from the other, making the offset from each branch equal and opposite and, by consequence, zero at the output of the summing amplifier.

Dual Current Source Nulling

Figure 8:
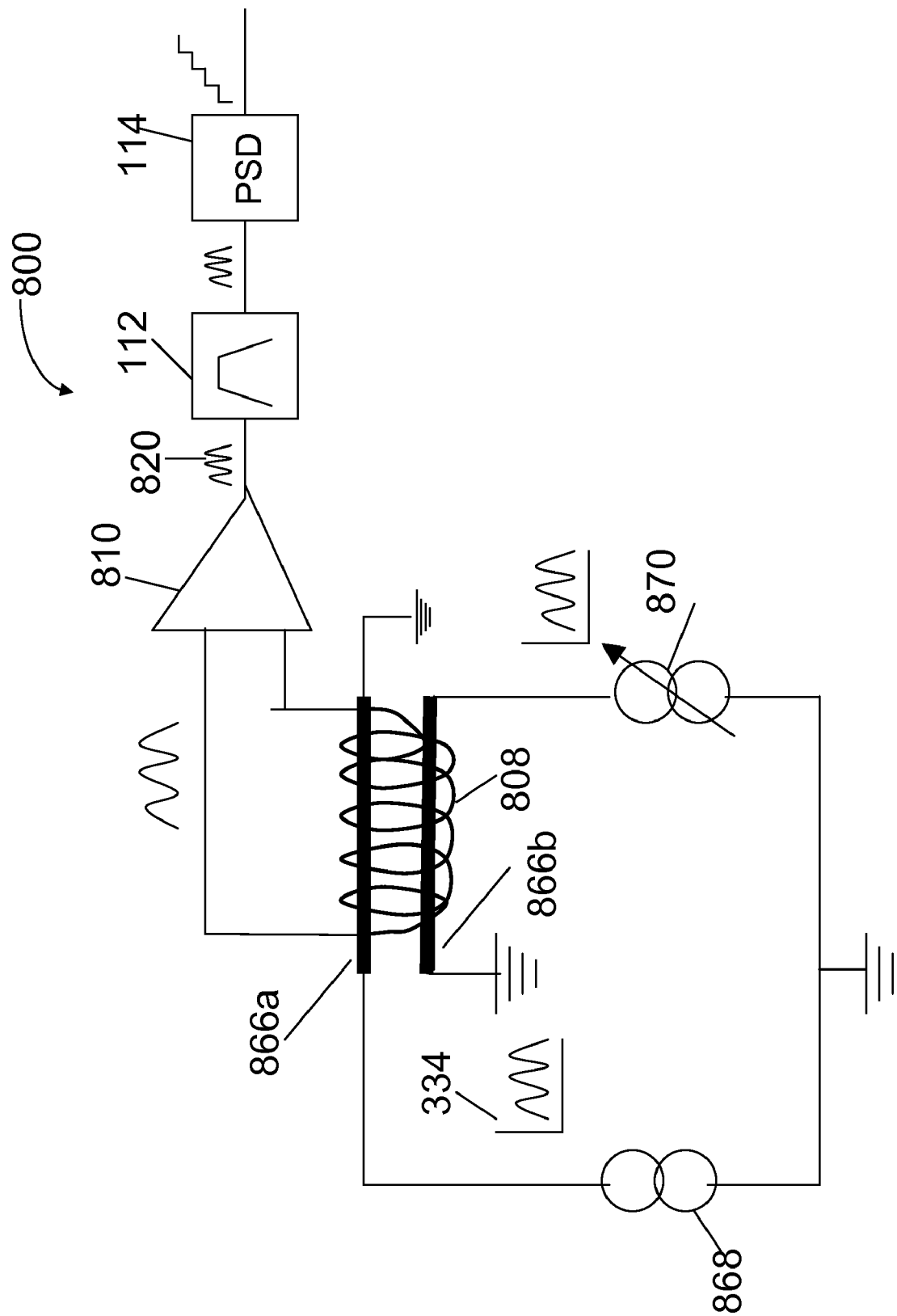
FIG. 8 illustrates a method of nulling the offset according to another aspect of the invention.

According to another aspect of the invention, as illustrated in FIG. 8, the offset is nulled by replacing the folded over sensing element by two identical parallel elements 866a and 866b, each driven by its own current source 868 and 870, at least one of these, 870, being adjustable. Either series connected sensing coils, one over each element, or single sensing coil 808, as shown, over the two sensing elements 866, can be used to get the magnetic signal and feed it to preamplifier 810.

As, in absence of applied external field, the signal from each sensing element is proportional to the product of the drive current by the offset from this element, adjusting the current in one wire so that the product of the offset and current is equal to the same product from the other element does effectively cancel the offset from the sensor. As in the previous implementation, the adjustable current source is trimmed, in the absence of any external field, for minimum signal at point 820.

Figure 9:
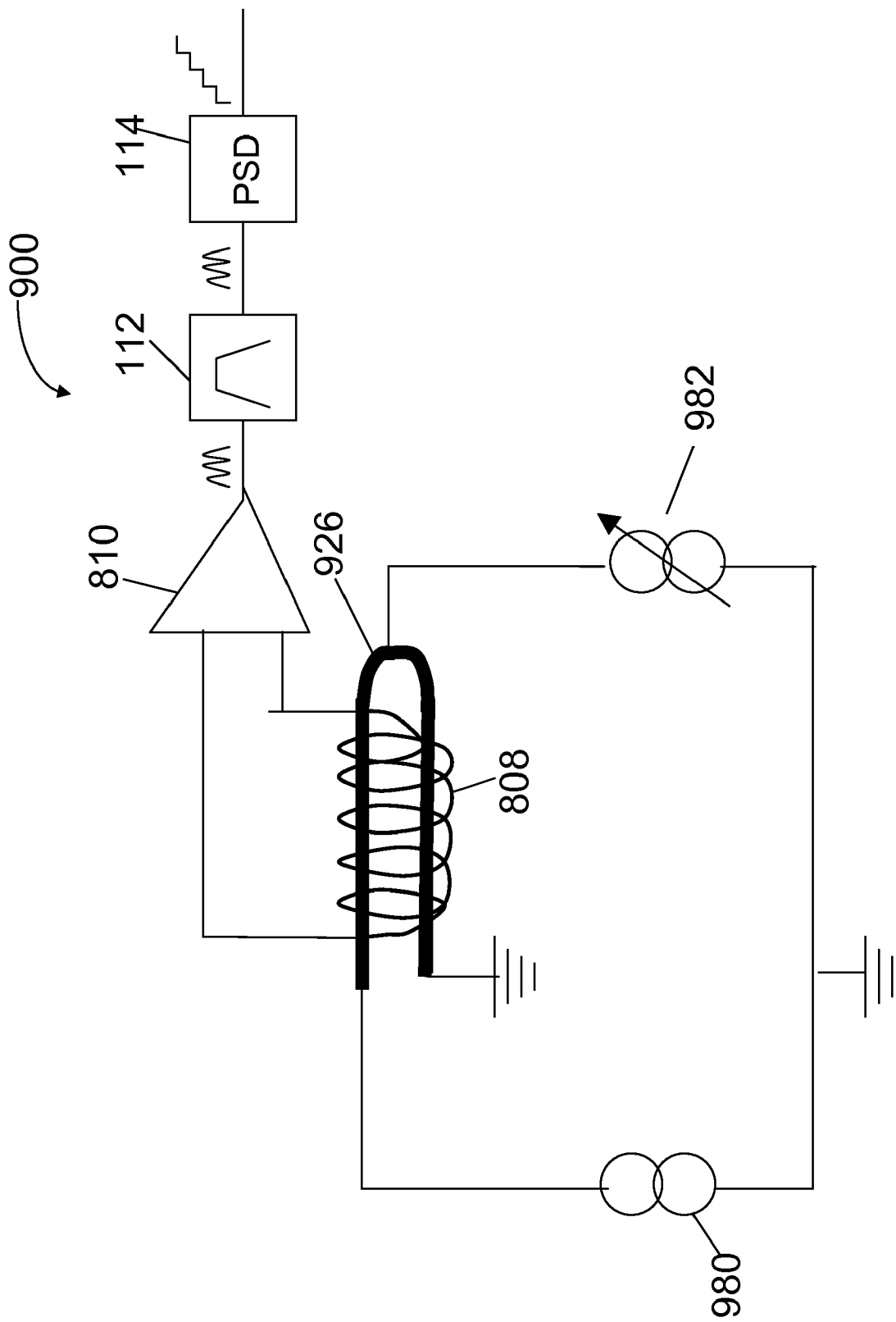
FIG. 9 illustrates an alternate implementation according to another aspect of the invention.

In another aspect of the present invention, as illustrated in FIG. 9, folded sensing element 926, is driven by "main" current source 980, but also connected to secondary adjustable "compensation" current source 982 at a mid point of the drive wire, where it is folded. As either branch of the drive wire may show more offset, "compensation" current source 982 needs to be able to either source or sink current to cancel the offset. However, it requires only a fraction of the total drive current. The net result is the same as the dual current source—having a slightly different current in each branch, and changing the gain of the branch to make sure that the product of the offset and current is equal and opposite in each branch and thus nulls the offset.

AC Magnetic Field Nulling

Figure 10:
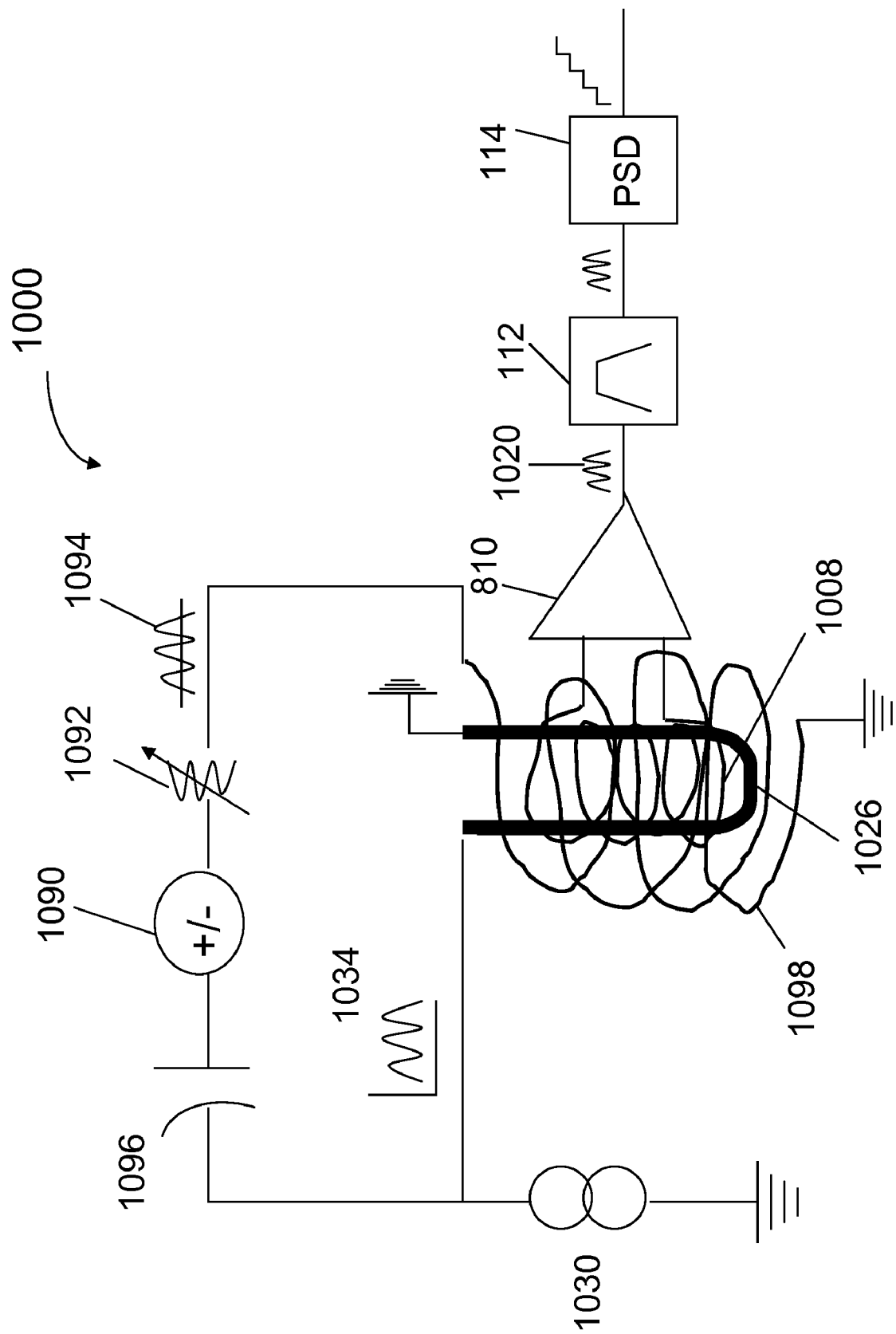
FIG. 10 illustrates yet another implementation according to another aspect of the invention.

As illustrated in FIG. 10, applying to the sensing coil an AC magnetic field equal and opposite to the residual offset field is another way to cancel the offset. This is done by winding an extra "nulling" winding 1098 over the usual sensing element 1026 and sensing coil 1008 assembly. The drive element is fed by the usual current source 1030. Feeding nulling coil 1098 from a sample of the exciting sinusoidal waveform 1034, through coupling capacitor 1096, attenuator 1092, and, if necessary, polarity reverser 1090, provides, when the attenuator is properly adjusted, a field equal and opposite to the offset field. Sensing coil 1008 picks the sum of the field from sensing element 1026 and the one from nulling winding 1098, thus effectively canceling the offset when the field from 1098 is equal and opposite to the offset. Capacitor 1096 prevents the DC component of excitation current 1034 from reaching the nulling winding, leaving a zero centered sinusoidal current 1094 through the nulling coil. As the net offset can be either polarity, polarity reverser 1090 allows cancellation of offsets of either polarity. Again, like in previous implementations, the offset nulling is adjusted by setting the attenuator so that, in absence of any external field, the signal at point 1020 is minimized.

While FIG. 10 illustrates the use of this aspect of the invention to eliminate the residual offset of a folded sensor element, it can also be used to cancel the offset from a single element sensor similar to the one illustrated in FIG. 1.

Quadrature Residual Nulling

Even with the best offset nulling, one will observe that there is still some signal at the output of the preamplifier following the sensor. In theory, this will not happen but, in a real sensor, various errors and inevitable leakages through parasitic induction and capacitances makes this inevitable. This residual signal is in quadrature (90 degrees out of phase) with the signal induced by the applied field. In principle it is rejected by the phase sensitive detector used to get the signal amplitude. While measuring large fields, this is not a problem. However, when measuring very small fields, the residual leakage signal amplitude is higher than the signal from the fields being measured and saturates phase sensitive detector 114, preventing the measurement of very low fields. The leakage needs to be cancelled for best performance. Another aspect of the invention is the cancellation of the quadrature leakage signal.

Figure 11:
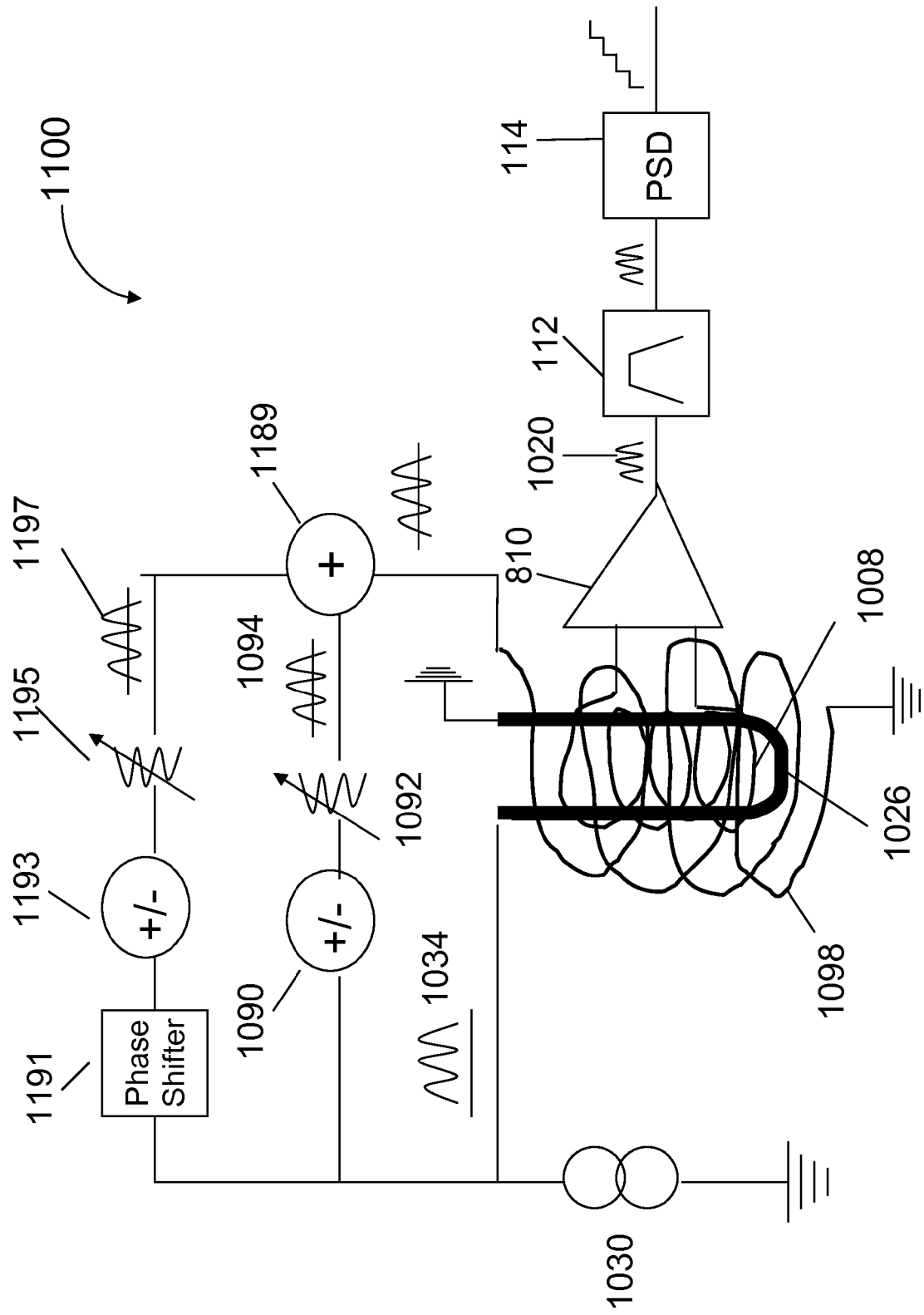
FIG. 11 illustrates the addition of a 90 degrees phase shifted sample according to another aspect of the invention.

Again, this can be done in different ways, one of which is adding an additional "quadrature" nulling path to the circuit of FIG. 10. FIG. 11 shows the addition. The quadrature path 1191, 1193, 1195 is identical with the main nulling circuit, i.e. 1090,1092, except for the addition of device 1191 that shifts the signal phase by 90 degrees. Both the "in-phase" compensation 1094, from 1090 and 1092, and the quadrature compensation 1197 from 1191, 1193, and 1195 are added together in 1189 before being applied to nulling coil 1098. Alternatively adjusting both attenuators 1092 and 1195, in the absence of external field, for minimum output at point 1020 will cancel both the offset from the sensing elements and the other parasitic leaks. This will allow for an absolute minimum preamplifier output in the absence of external field and will also allow an increase in the electronics gain, which will provide for extra sensitivity.

Figure 12A:
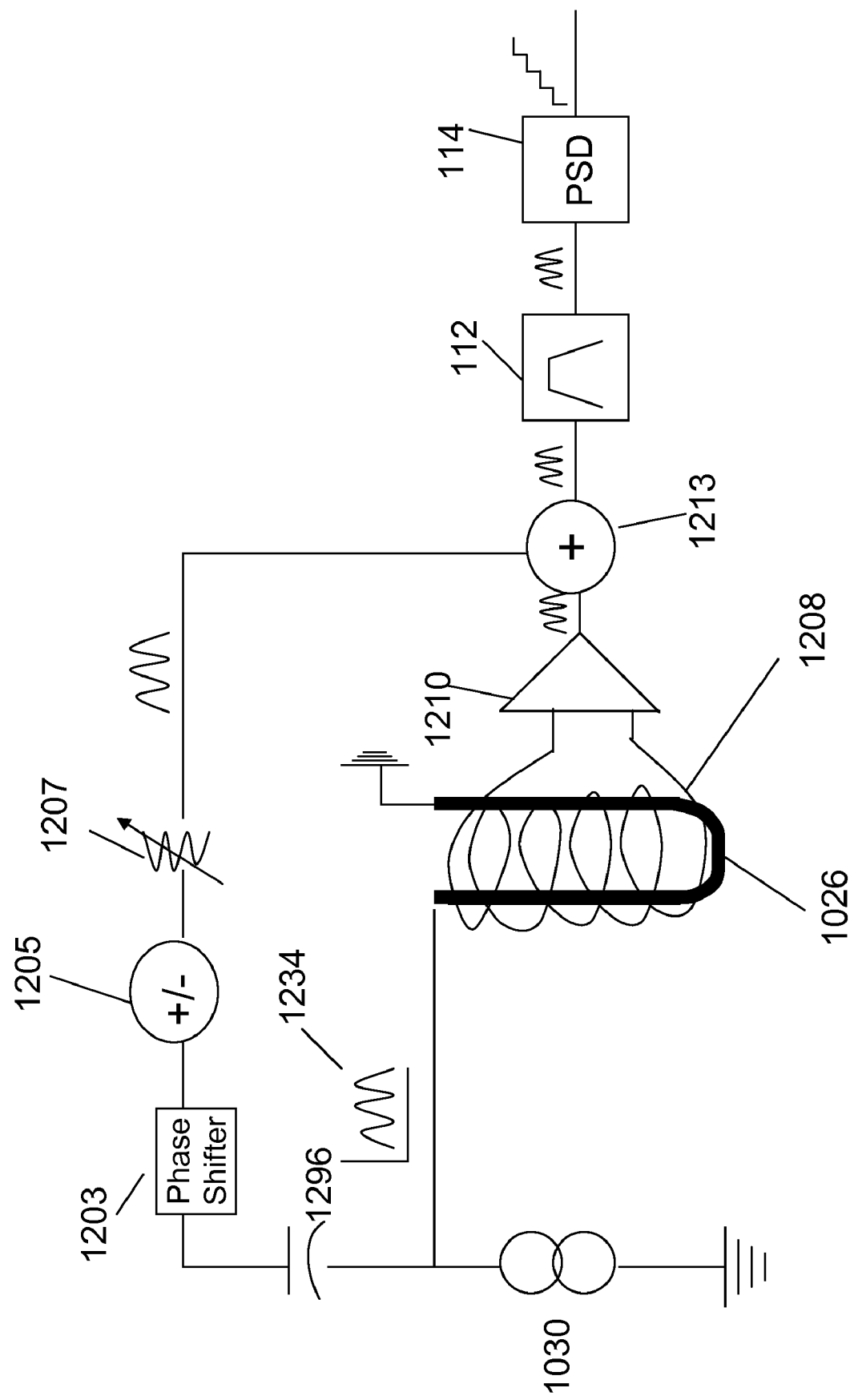
FIGS. 12a and 12b also illustrate the addition of a 90 degree phase shifted sample.
Figure 12B:
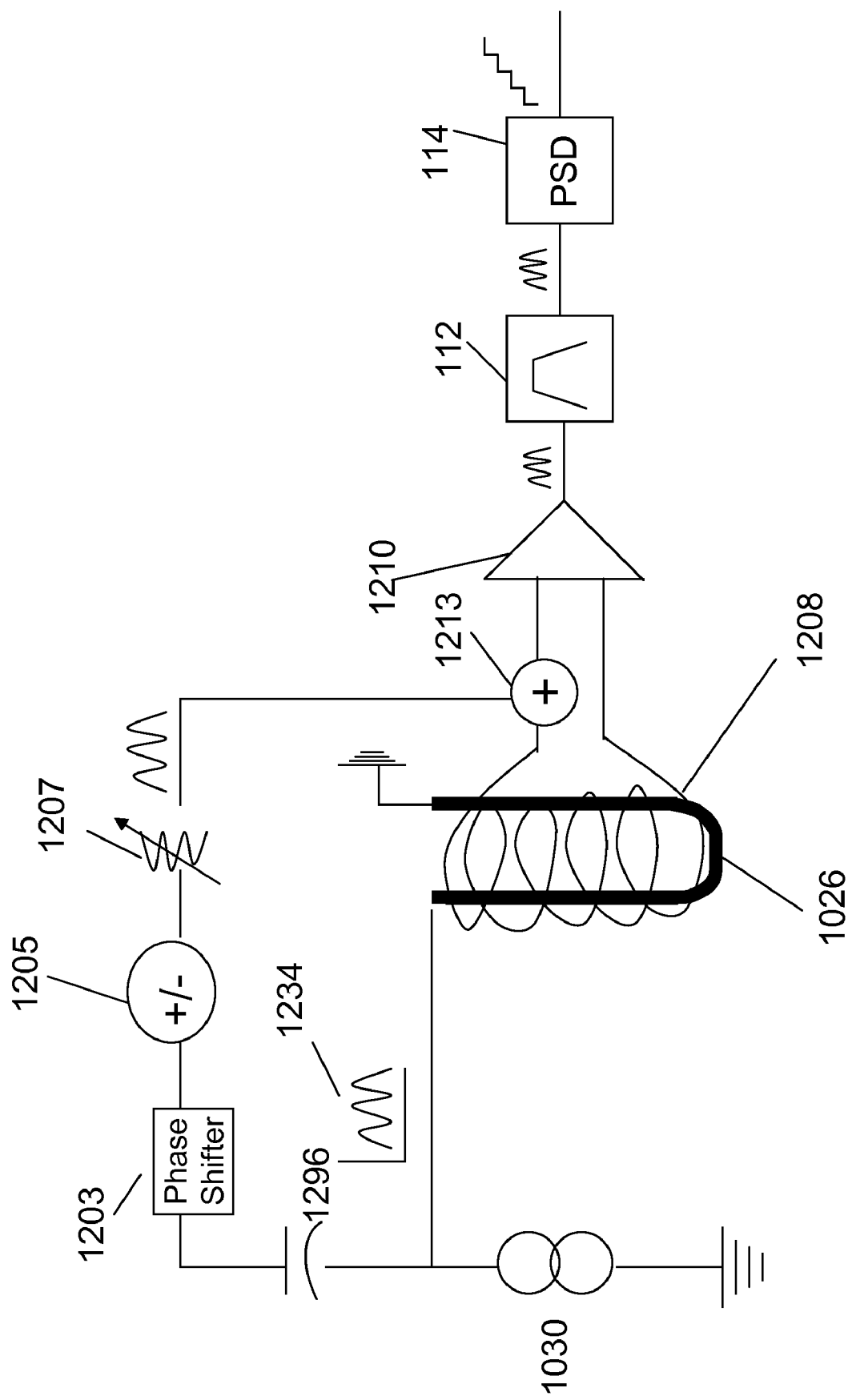

Another way of canceling the quadrature leakage is illustrated in FIGS. 12A and 12B. The leakage is cancelled by adding a 90 degrees phase shifted sample of the AC component of excitation waveform 1234 to the signal from sensing coil 1208. If this compensation signal is equal and opposite to the total leakage, the leakage will be effectively cancelled. The compensation signal may be added by adder 1213 either after preamplifier 1210, as shown in FIG. 12A or before the preamplifier, as shown in FIG. 12B.

To provide the cancellation signal, a sample of the excitation waveform is shifted in phase by 90 degree phase shifter 1203, inverted if necessary by polarity reverser 1205, and attenuated by attenuator 1207 to make it equal to the residual leakage to null, and added to the signal path at adder 1213.

Figure 13:
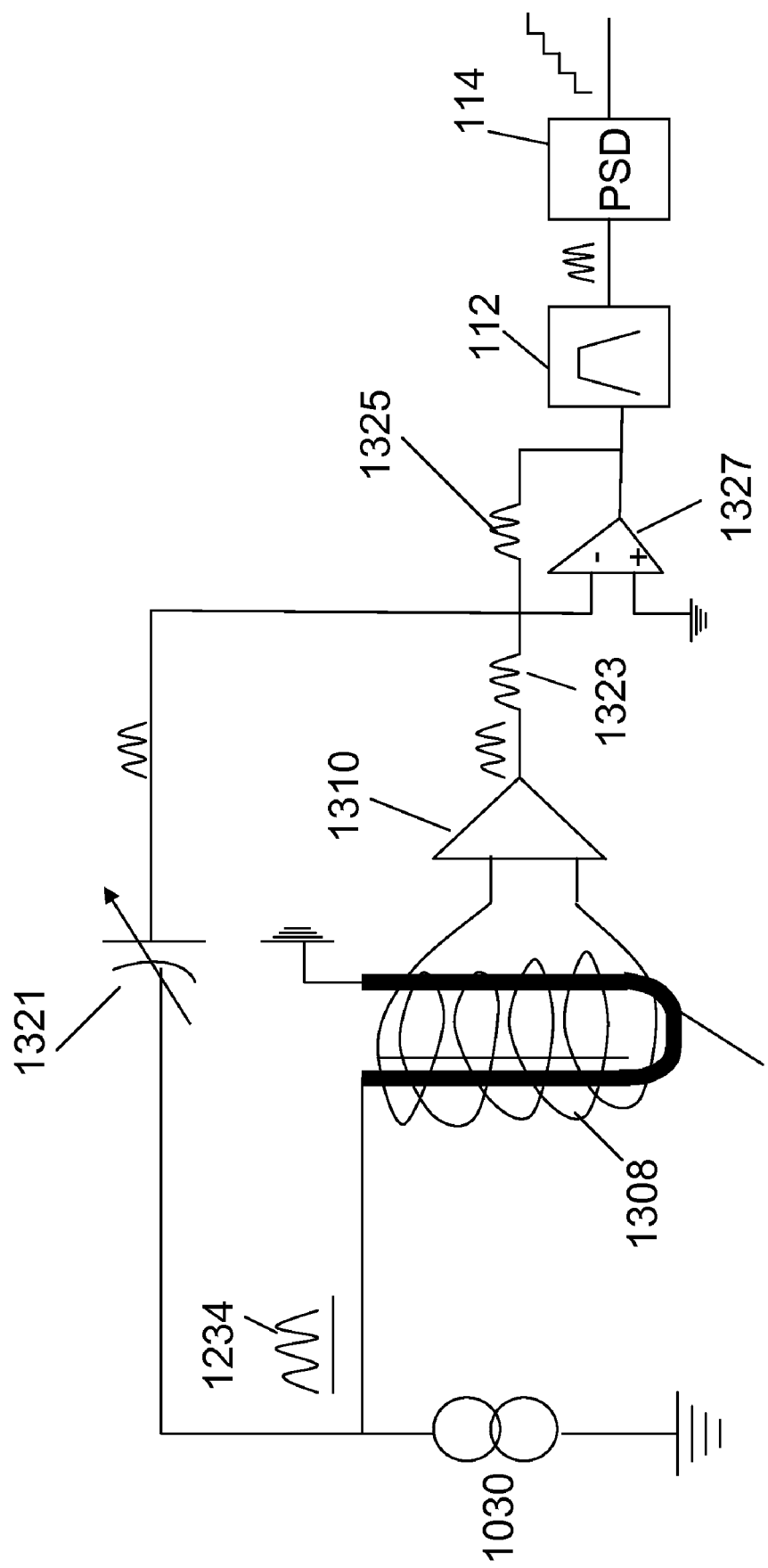
FIG. 13 illustrates a single variable capacitor according to an aspect of the invention.

In practice, phase shifter 1203, polarity reverser 1205, and attenuator 1207 can be combined with capacitor 1296. An implementation according to one embodiment is illustrated in FIG. 13. This embodiment uses single variable capacitor 1321 to effect the nulling. If the capacitor is small enough, the compensation signal is shifted by 90 degrees by going through the capacitor. It is then added to the signal from the sensing coil 1308 by the summing amplifier made of operational amplifier 1327 and resistors 1323 and 1325. Polarity reversal is effected, if necessary, by connecting the capacitor to the positive input of the amplifier instead than the negative one. Again, summing can be effected either before or, as illustrated, after preamplifier 1310.

As for the offset nulling, the quadrature residual nulling aspects of the present invention apply equally well to the folded element sensor shown in the figures or to straight sensor elements as shown in FIG. 1

Overall System Implementation

Figure 14:
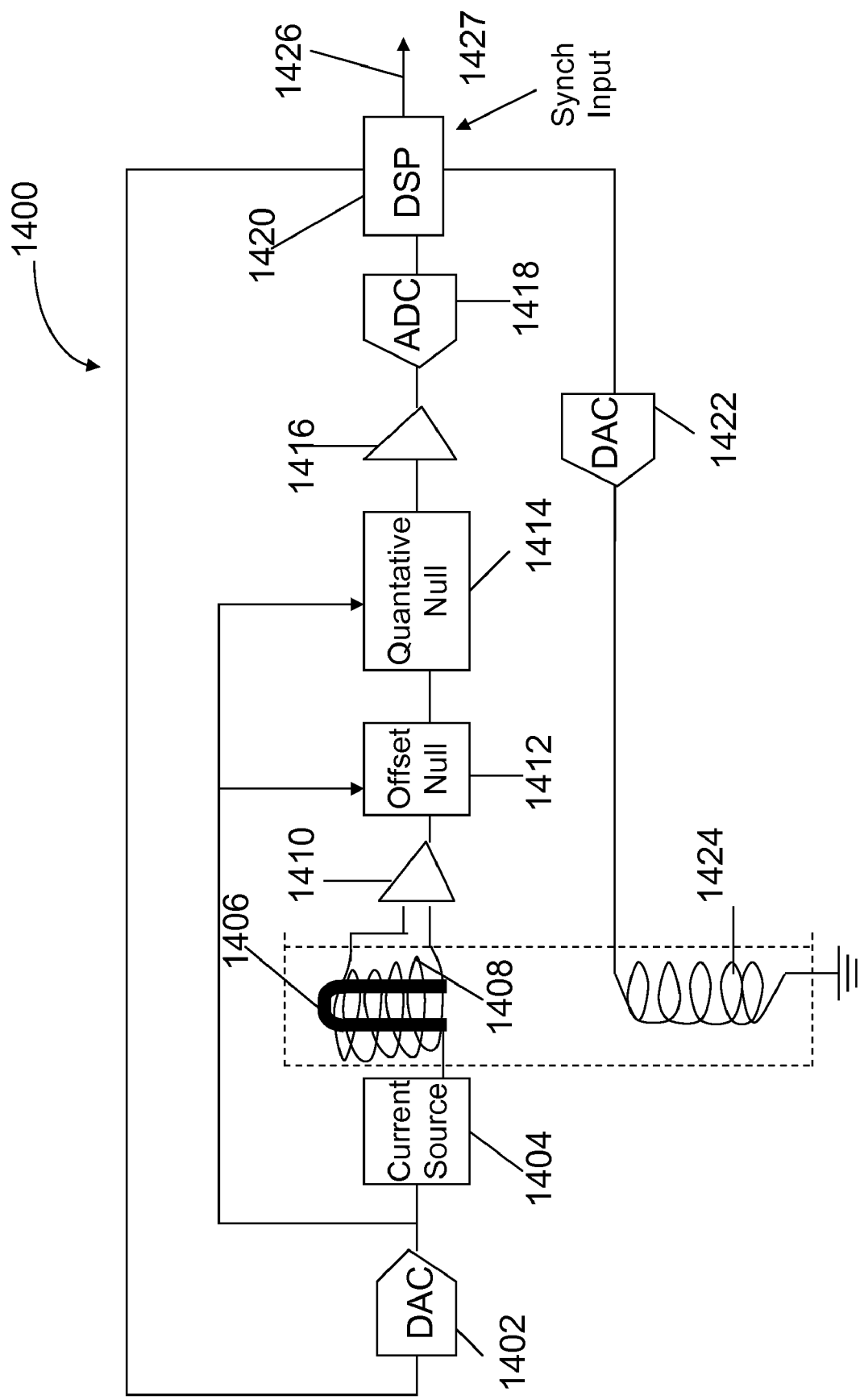
FIG. 14 illustrates a whole magnetometer implementation according to an aspect of the invention.

FIG. 14 illustrates the whole magnetometer implementation for a single channel according to one aspect of the present invention. The actual magnetometer unit is triaxial, measuring magnetic fields in the X, Y, and Z directions; as such, the magnetometer would have three channels, one for measuring the magnetic field in each direction. Each of the channels is identical to the one illustrated in FIG. 14 except that digital signal processor 1420 and excitation DAC 1402 are common to all channels. Digital output 125 may also be combined in the output stream, and thus considered common, as the three channels are combined in the output stream. Sync input 1427 is also common. Other elements may also be common to more than one channel. All other non-common parts are repeated for each channel. Sensor magnetic element 1406 is driven from current source 1404 providing both the DC bias and the AC excitation field. Current source 1404 is a conventional voltage controlled current source similar to the one represented in FIG. 4 driven in its turn from digital to analog converter 1402, to which is applied a numerical representation of the drive waveform made of both the DC bias and the sine wave.

The sensing coil 1408 signal is first amplified by preamplifier 1410 and then compensated for both offset 1412 and quadrature 1414 residuals by one or the other appropriate circuits described before, for example, the circuits of FIGS. 7 and 13, respectively, allowing further amplification of the signal at amplifier 1416 which may also include the bandpass function. The amplified output is applied to analog to digital converter 1418 sampling at twice the excitation frequency, implementing the first stage of the phase sensitive detection.

The output of analog to digital converter 1418 is applied to digital signal processor 1420 which completes the demodulation of the signal and converts it to a number representative of the measured magnetic field.

This magnetometer output is fully digital. The 3 direction field values are output on a single serial digital stream 1426.

Synchronization input 1427 is provided, to allow time synchronization between the various magnetometers and other sensors of the field system. This takes the form of a series of time related pulses, either from the data acquisition system accepting the magnetometer data or from a GPS receiver or other such device.

High resolution digital to analog converter 1422, controlled by DSP 1420, feeds extra DC field nulling coil 1424 wound over the sensor assembly and particularly sensing coil 1408. This nulling is used to cancel the earth field, which preserves the dynamic range for the small variations in fields that are to be measured.

In some embodiments, DAC 1422 is driven in full flux feedback mode, in which it will be updated at every output sample. In other embodiments, it is kept a fixed value, following an autonulling phase in which the magnetometer is operated at a reduced sensitivity, while the DSP programs adjust DAC 1422 for zero output. The DAC correction is then kept substantially constant until the end of the recording phase.

In some embodiments in which AC magnetic field nulling has been implemented as the offset nulling solution, nulling coil 1424 is the same as AC compensation coil 1098, the DC field nulling from DAC 1422 being added to the AC compensation from 1189.

In terms of physical size, it is generally preferable to keep the sensing coil diameter as small as possible. This is in part because larger diameter coils pick more ambient field noise and proportionally less signal from the magnetic sensing element. However, as the sensing coil diameter gets smaller, manufacturing can become more difficult. With regard to length, the signal output is proportional to the length of the magnetic wire/sensing coil. Increasing the wire length provides more signal. On the other hand, wire resistance also increases with length. Drive power increases with the square of the resistance and it is generally preferred to keep the required power as low as possible to save on battery size and weight. Furthermore, very thin and long sensors are generally more difficult to manufacture, particularly to make straight, and also make for bigger overall magnetometers, which tend to be less convenient.

One aspect of the present invention, which provides a reasonable output signal at an acceptable drive power, uses a 25 mm long sensing coil with a 1 mm inside diameter. The drive wire is made to protrude a bit from each side but is still kept as short as reasonably possible, for an overall length of 35-40 mm in this aspect.

Integrated Magnetotelluric Station

In some aspects of the invention, an integrated magnetotelluric station is disclosed. An integrated magnetotelluric station is a single integrated package that performs all the measurement and data acquisition tasks of a magnetotelluric station. In one embodiment, the package includes: three magnetometers as described above, one for each of the X, Y, and Z magnetic components; two electrical inputs, one each for the X and Y electric fields; a timing or synchronization device, a GPS receiver by way of nonlimiting example; and a device for data recording; an interface to an operator console or terminal, to set up parameters. The integrated magnetotelluric station may further include a high speed data link to transmit the data to a central processing station. The integrated magnetotelluric station generally replaces the three independent magnetic sensors and the data logger sometimes used to measure the magnetic field in three directions.

What is claimed:

1. A fundamental mode orthogonal fluxgate magnetometer comprising:
   a magnetic alloy sensing element;
   a current source to supply an excitation current to the sensing element, said excitation current including a DC component on which is superimposed a smaller, high frequency, AC xcitation current;
   a sensing coil wound over the sensing element for picking up a signal proportional to an applied magnetic field;
   an amplifier for amplifying the signal picked up by the sensing coil;

a signal detector for detecting the amplified signal and producing an output voltage proportional to the applied magnetic field;
an electronic circuit to null the magnetometer offset;
a second coil wound over the sensing coil; and
a compensating circuit including a coupling capacitor, an adjustable attenuator, and a switchable polarity reverser;
wherein the compensating circuit takes a sample of the high frequency AC part of the excitation current and applies it to the second coil to create a field substantially equal and opposite to the magnetometer offset.

2. The fundamental mode orthogonal fluxgate magnetometer of claim 1, further comprising:
an adjustable compensation current source connected to the sensing element;
wherein the sensing element is a wire;
wherein the wire includes a single segment with two branches, and wherein a compensation current from the compensation current source is applied by the compensation current source at a midpoint of the wire to provide a different drive current in each branch.

3. The fundamental mode orthogonal fluxgate magnetometer of claim 1, wherein the magnetic alloy sensing element is an amorphous magnetic alloy wire.

4. The fundamental mode orthogonal fluxgate magnetometer of claim 1, wherein the detector outputs a digital number proportional to the magnetic field.

5. The fundamental mode orthogonal fluxgate magnetometer of claim 1, further comprising an electronic circuit to null residual AC leakage.

6. The fundamental mode orthogonal fluxgate magnetometer of claim 5, wherein the circuit to null residual AC leakage includes an adjustable capacitor; and
wherein the adjustable capacitor is located between the current source and the signal path of the amplifier.

7. The fundamental mode orthogonal fluxgate magnetometer of claim 5, wherein the magnetic alloy sensing element is an amorphous magnetic alloy wire.

8. The fundamental mode orthogonal fluxgate magnetometer of claim 5, wherein the detector outputs a digital number proportional to the magnetic field.

9. The fundamental mode orthogonal fluxgate magnetometer of claim 7, wherein the detector outputs a digital number proportional to the magnetic field.

10. The fundamental mode orthogonal fluxgate magnetometer of claim 1, further comprising:
processing software for calculating the applied magnetic field;
wherein the magnetometer is contained in a single package.

11. The fundamental mode orthogonal fluxgate magnetometer of claim 1, further comprising:
an integrated timing device for synchronizing the magnetometer to other magnetometer units.

12. The fundamental mode orthogonal fluxgate magnetometer of claim 11, wherein the integrated timing device is a GPS receiver.

13. The fundamental mode orthogonal fluxgate magnetometer of claim 5, further comprising:
processing software;
wherein the magnetometer is contained in a single package.

14. The fundamental mode orthogonal fluxgate magnetometer of claim 5, further comprising:
an integrated timing device for synchronizing the magnetometer to other magnetometer units.

15. The fundamental mode orthogonal fluxgate magnetometer of claim 14, wherein the integrated timing device is a GPS receiver.

16. The fundamental mode orthogonal fluxgate magnetometer of claim 1, further comprising:
an integrated inclination sensor for correcting leveling errors.

17. The fundamental mode orthogonal fluxgate magnetometer of claim 4, further comprising:
an integrated data recorder for storing the output digital number.

18. The fundamental mode orthogonal fluxgate magnetometer of claim 17, further comprising:
circuits for measuring the electrical fields from external electrodes and for recording or transmitting the measure of the electrical fields with the output digital number.

19. The fundamental mode orthogonal fluxgate magnetometer of claim 8, further comprising:
an integrated data recorder for storing the output digital number.

20. The fundamental mode orthogonal fluxgate magnetometer of claim 19, further comprising:
circuits for measuring the electrical fields from external electrodes and for recording or transmitting the measure of the electrical fields with the output digital number.

21. A fundamental mode orthogonal fluxgate magnetometer comprising:
a magnetic alloy sensing element through which an excitation current flows, said excitation current including a DC component on which is superimposed a smaller, high frequency, AC excitation current;
a sensing coil wound over the sensing element for picking up a signal proportional to an applied magnetic field;
an amplifier for amplifying the signal picked up by the sensing coil;
a signal detector for detecting the amplified signal and producing an output voltage proportional to the applied magnetic field;
an electronic circuit for nulling a magnetometer offset;
a second sensing coil; and
a second amplifier to amplify signals picked up by the second sensing coil;
wherein the sensing element is a wire having a plurality of branches;
wherein each branch of the wire goes through a sensing coil;
wherein the signal picked up by each sensing coil is amplified individually by an amplifier;
wherein at least one of the amplifiers has an adjustable gain;
wherein the outputs of the plurality of amplifiers are summed to provide a final output; and
wherein the magnetometer offset is nulled by adjusting the gain of the at least one adjustable gain amplifier.

22. The fundamental mode orthogonal fluxgate magnetometer of claim 21, wherein the sensing element is a wire; wherein the wire is split in two parallel segments; wherein each parallel segment is driven by a different current; and wherein the magnetometer offset of the final output is nulled by the difference in current.

23. A fundamental mode orthogonal fluxgate magnetometer comprising:
a magnetic alloy sensing element through which an excitation current flows, said excitation current including a DC component on which is superimposed a smaller, high frequency, AC excitation current;

a sensing coil wound over the sensing element for picking up a signal proportional to an applied magnetic field;
an amplifier for amplifying the signal picked up by the sensing coil;
a signal detector for detecting the amplified signal and producing an output voltage proportional to the applied magnetic field;
an electronic circuit for nulling a magnetometer offset;
a second coil wound over the sensing coil; and
a compensating circuit including a coupling capacitor, an adjustable attenuator, and a switchable polarity reverser;
wherein the compensating circuit takes a sample of the high frequency AC part of the excitation current and applies it to the second coil to create a field substantially equal and opposite to the magnetometer offset.

24. The fundamental mode orthogonal fluxgate magnetometer of claim 23, further comprising:
a 90 degrees phase shifter;
a second attenuator; and
a summer;
wherein the phase shifter provides a 90 degrees shifted sample of the high frequency AC part of the excitation current; and
wherein the phase shifted sample is attenuated by the second attenuator and applied to the nulling coil.

25. The fundamental mode orthogonal fluxgate magnetometer of claim 24, further comprising:
an adjustable capacitor; and
a second summer;
wherein residual AC leakage is nulled by the adjustable capacitor.

26. A fundamental mode orthogonal fluxgate magnetometer comprising:
a magnetic alloy sensing element through which an excitation current flows, said excitation current including a DC component on which is superimposed a smaller, high frequency, AC excitation current;
a sensing coil wound over the sensing element for picking up a signal proportional to an applied magnetic field;
an amplifier for amplifying the signal picked up by the sensing coil;
a signal detector for detecting the amplified signal and producing an output voltage proportional to the applied magnetic field;
a first electronic circuit for nulling residual AC leakage;
a second electronic circuit for nulling the magnetometer offset;
a second coil wound over the sensing coil; and
a compensating circuit including a coupling capacitor, an adjustable attenuator, and a switchable polarity reverser;
wherein the compensating circuit takes a sample of the high frequency AC part of the excitation current and applies it to the second coil to create a field substantially equal and opposite to the magnetometer offset.

27. A method of measuring a magnetic field, the method comprising:
driving a magnetic alloy sensing element from a current source;
producing an excitation current to flow through the sensing element, wherein the excitation current has a DC component on which is superimposed a smaller, high frequency AC excitation current;
picking up a signal proportional to the applied magnetic field from a sensing coil wound over the sensing element;
amplifying the signal picked up from the sensing coil;
detecting the amplified signal to produce an output voltage proportional to the applied magnetic field;
nulling the magnetometer offset with an electronic circuit;
sampling the high frequency AC excitation current using a compensating circuit; and
applying the sampled high frequency AC excitation current to a second coil to create a field substantially equal and opposite to the magnetometer offset.

28. A method of measuring a magnetic field, the method comprising:
driving a magnetic alloy sensing element;
producing an excitation current to flow through the sensing element, wherein the excitation current has a DC component on which is superimposed a smaller, high frequency AC excitation current;
picking up a signal proportional to the applied magnetic field from a sensing coil wound over the sensing element;
amplifying the signal picked up from the sensing coil; and
detecting the amplified signal to produce an output voltage proportional to the applied magnetic field;
nulling the magnetometer offset with an electronic circuit;
sampling the high frequency AC excitation current using a compensating circuit; and
applying the sampled high frequency AC excitation current to a second coil to create a field substantially equal and opposite to the magnetometer offset.

29. A method of measuring a magnetic field, the method comprising:
driving a magnetic alloy sensing element;
producing an excitation current to flow through the sensing element, wherein the excitation current has a DC component on which is superimposed a smaller, high frequency AC excitation current;
picking up a signal proportional to the applied magnetic field from a sensing coil wound over the sensing element;
amplifying the signal picked up from the sensing coil;
detecting the amplified signal to produce an output voltage proportional to the applied magnetic field;
nulling residual AC leakage with an electronic circuit;
nulling the magnetometer offset with an electronic circuit;
sampling the high frequency AC excitation current using a compensating circuit; and
applying the sampled high frequency AC excitation current to a second coil to create a field substantially equal and opposite to the magnetometer offset.

30. The method of claim 27, further comprising:
nulling residual AC leakage with an electronic circuit.

31. An integrated magnetotelluric station comprising:
three fundamental mode orthogonal fluxgate magnetometers, one magnetometer to measure each of the X, Y, and Z magnetic components;
two electric inputs, one each for the X and Y electric fields;
a timing device;
a data recording device; and
an interface to an operator console for setting up parameters of the magnetometer,
wherein each fundamental mode orthogonal fluxgate includes a magnetic alloy sensing element, a current source to supply current to the sensing element, a sensing coil wound over the sensing element, an amplifier, and a signal detector;
wherein each sensing coil of each fundamental mode orthogonal fluxgate magnetometer picks up a signal proportional to a respective component applied magnetic field;

wherein each current source for each fundamental mode orthogonal fluxgate magnetometer generates an excitation current to flow through the respective sensing element;

wherein each excitation current has a DC component on which is superimposed a smaller, high frequency AC excitation current;

wherein each amplifier amplifies the signal picked up from the respective sensing coil;

wherein each detector detects the amplified signal of the respective amplifier and produces an output voltage proportional to the respective component of the applied magnetic field; and wherein at least one of the three fundamental mode orthogonal fluxgate magnetometers samples the high frequency AC excitation current using a compensating circuit and applies it to a second coil to create a field substantially equal and opposite to the magnetometer effect.

32. The integrated magnetotelluric station of claim 31, wherein the timing device is a GPS receiver.

33. The integrated magnetotelluric station of claim 31, further comprising a high speed data link to transmit data to a central processing station.

34. The integrated magnetotelluric station of claim 31, further comprising an integrated inclination sensor for correcting leveling errors.

35. The integrated magnetotelluric station of claim 31, wherein the magnetic alloy sensing element is an amorphous alloy wire.

36. The integrated magnetotelluric station of claim 31 further comprising an electronic circuit to null residual AC leakage.

37. The integrated magnetotelluric station of claim 36 where the circuit to null residual AC leakage includes an adjustable capacitor.

* * * * *